US00RE38657E

(19) United States
(12) Reissued Patent
Pulvirenti

(10) Patent Number: US RE38,657 E
(45) Date of Reissued Patent: Nov. 23, 2004

(54) CURRENT LIMITATION PROGRAMMABLE CIRCUIT FOR SMART POWER ACTUATORS

(75) Inventor: Francesco Pulvirenti, Acireale (IT)

(73) Assignee: STMicroelectronics, SRL, Agrate Brianza (IT)

(21) Appl. No.: 09/659,378

(22) Filed: Sep. 8, 2000

Related U.S. Patent Documents

Reissue of:
(64) Patent No.: 5,804,956
Issued: Sep. 8, 1998
Appl. No.: 08/805,213
Filed: Feb. 27, 1997

(30) Foreign Application Priority Data

Feb. 29, 1996 (EP) ..... 96830089

(51) Int. Cl.[7] ..... G05F 1/573
(52) U.S. Cl. ..... 323/277
(58) Field of Search ..... 323/277, 282

(56) References Cited

U.S. PATENT DOCUMENTS 3,600,634 A * 8/1971 Muench
3,769,573 A * 10/1973 Scantlin
4,608,529 A * 8/1986 Mallinson ..... 323/275
4,609,863 A * 9/1986 Asai et al. ..... 323/223
4,644,250 A * 2/1987 Hartgring ..... 323/225
4,841,219 A * 6/1989 Lonergan ..... 323/277
4,899,098 A * 2/1990 Gariboldi ..... 323/277
5,010,293 A * 4/1991 Ellersick ..... 323/278
5,036,269 A * 7/1991 Murari et al. ..... 323/275
5,113,307 A * 5/1992 Meyer et al. ..... 361/154
5,229,578 A * 7/1993 Akihisa et al. ..... 323/908
5,523,935 A * 6/1996 Leopold ..... 323/908
5,568,043 A * 10/1996 Wu ..... 323/231
5,631,549 A * 5/1997 Hong ..... 323/277
5,637,990 A * 6/1997 Kato et al. ..... 323/277
6,150,800 A * 11/2000 Kinoshita et al. ..... 323/274

FOREIGN PATENT DOCUMENTS

EP 0483744 A2 * 5/1992 ..... H02M/7/537
EP 0554936 A1 * 8/1993 ..... H03K/17/60
EP 0556663 A1 * 8/1993 ..... G05F/1/565
EP 0647026 A2 * 4/1995 ..... H03K/17/082

* cited by examiner

*Primary Examiner*—Jeffrey Sterrett
(74) *Attorney, Agent, or Firm*—Lisa K. Jorgenson; Bryan A. Santarelli

(57) ABSTRACT

A circuit for limitation of maximum current delivered by a power transistor comprises: a network for detection of the current delivered by the power transistor which generates a first electrical signal; a reference network for generating a reference current proportional to a resistor and self-limited, provided by means of a current generator circuit and a limiting circuit with current mirror; and an operational amplifier which compares the first electrical signal with the reference current and which tends to inhibit the power transistor if the current delivered exceeds a certain threshold value.

50 Claims, 2 Drawing Sheets

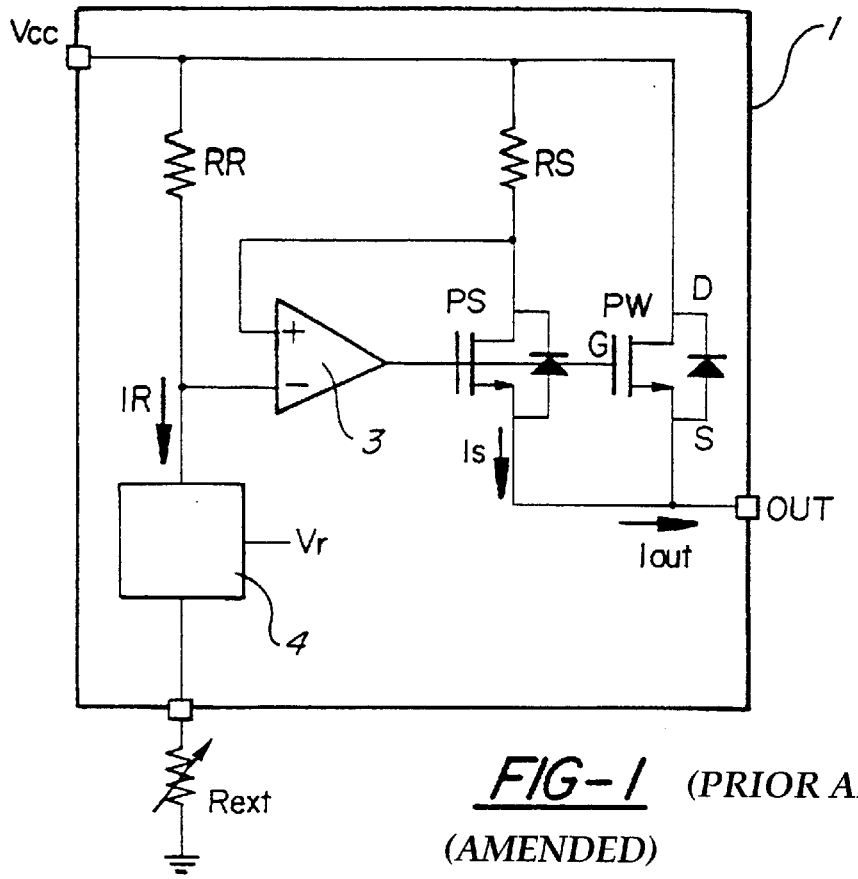
FIG-1 (PRIOR ART)
(AMENDED)
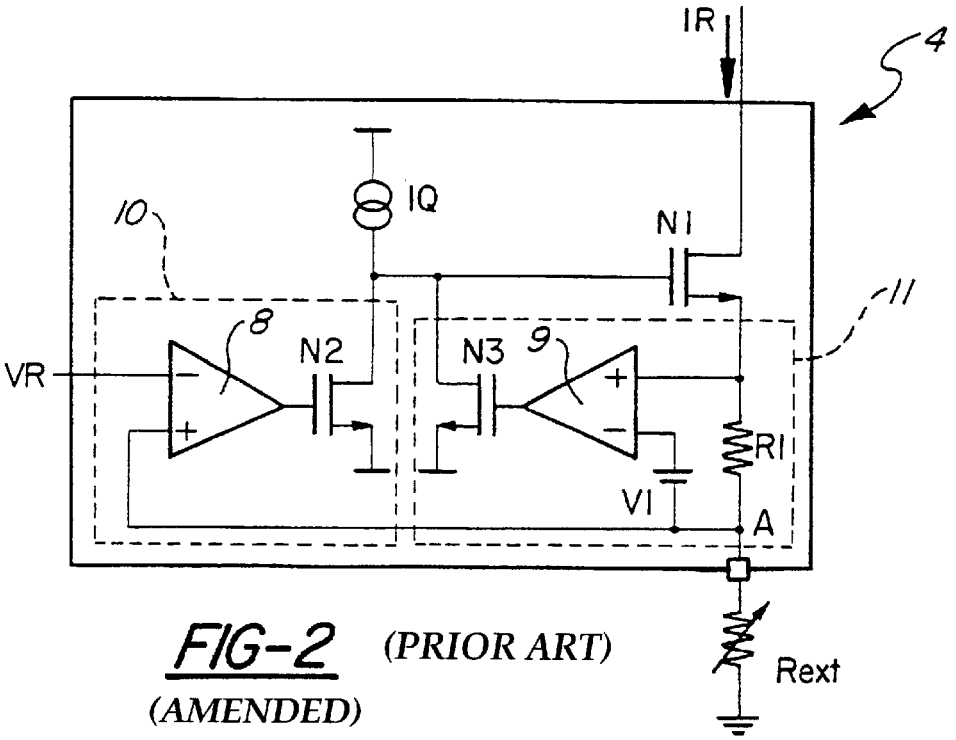
FIG-2 (PRIOR ART)
(AMENDED)

CURRENT LIMITATION PROGRAMMABLE CIRCUIT FOR SMART POWER ACTUATORS

Matter enclosed in heavy brackets [ ] appears in the original patent but forms no part of this reissue specification; matter printed in italics indicates the additions made by reissue.

FIELD OF THE INVENTION

The present invention relates to a circuit for protection of the output stage of an intelligent power actuator from overloads and short circuits. The need for protecting these devices which can be switches, amplifiers and voltage or current regulators appears obvious when the power in play becomes high because an overload or an accidental short circuit could irreparably damage both the load and the device.

In many applications and in particular in current regulators it is often required that the limitation current be programmable from outside the integrated circuit.

PRIOR ART

The output stage of the device which is the subject of the present invention is provided by means of a power transistor and the technique used for limiting the current is that of driving the above mentioned transistor with a negative feedback network which tends to inhibit the transistor when the current running therein exceeds a certain predefined threshold. The simplest way to detect the current is that of measuring the voltage drop on a resistor—termed 'sense' resistor—placed in series with the power transistor.

However, in the case of 'low drop' applications, i.e. in which the voltage drop on the power transistor must be very low, this technique has the obvious disadvantage of increasing the voltage drop and requiring, as a sense resistor, a resistor with power structure.

In these cases it is possible to use a circuit solution like the one illustrated in FIG. 1 in which is shown a current limitation circuit in a final stage of a power actuator. In this circuit the limitation circuit is proportional to a reference current obtained through a variable resistor Rext which is normally outside the integrated device. The output current Iout is divided and only part of it is measured through a sense resistor RS connected in series with a sense transistor PS with the obvious advantage that the output resistance is not changed.

The transistor PS, termed 'power sense', must be well coupled with the power transistor PW and is sized with an area n times smaller than the total area occupied by both the transistors. In this manner when both the transistors PW and PS work in the saturation region the current running in the transistor PS is Is=Iout/n.

The voltage drop at the ends of the resistor RS is compared by a comparator 3 with a reference voltage obtained by running a current IR of known value in a resistor RR. In particular the comparator 3 is an operational amplifier whose output is connected to the control terminals of the transistors PS and PW.

The reference current IR is generated inside the device by the circuit block 4 which generates a current proportional to the external resistor Rext.

In this circuit solution the output current Iout is limited when it reaches the value IL=K*IR where the multiplying factor K depends on the relationship of the resistors RR and RS and on the area relationship n of the transistors PS and PW in accordance with the following formula.

$$K = n \cdot \frac{R_R}{R_S}$$

The reference current IR generated by the circuit block 4 is inversely proportional to the variable resistor Rext $$I_R = \frac{V_R}{R_{ext}}$$

Hence, in the case of a short circuit or an overload the limitation current IL will be:

$$I_L = K \cdot \frac{V_R}{R_{ext}}$$

As may be readily seen from this last equation, the circuit block 4 is to be implemented in such a manner as to prevent the limitation current from becoming too high if, intentionally or by error, the value of the resistor Rext drops too much or is zeroed.

Two circuit solutions for generating a reference current IR inversely proportional to the value of a resistor are proposed by B. Gilbert in the article "A Versatile Monolithic Voltage-to-Frequency Converter" published in IEEE Journal of Solid-State Circuits in December 1976 and J. F. Kukielka and Solid-State Circuits in December 1976 and J. F. Kukielka and R. G. Meyer in the article "A High-Frequency Temperature-Stable Monolithic VCO" published in IEEE Journal of Solid-State Circuits in December 1981.

In the above mentioned circuits, termed by the authors "Voltage to current converter", the reference current is not limited and becomes high as the value of the resistor Rext decreases.

To obviate this problem in the prior art the circuit block 4 is commonly implemented starting from the operating principle of the circuits proposed by Gilbert, Kukielka and Meyer with the addition of other circuitry having the function of limiting the reference current.

A practical embodiment of the circuit block 4 in accordance with the prior art is shown in FIG. 2. In the diagram of FIG. 2 there can be distinguished the following circuit parts.

a MOS transistor N1, a current generator IQ, a regulation circuit 10 consisting of an operational amplifier 8 and a MOS transistor N2, and a limitation current circuit 11 consisting of an operational amplifier 9, a MOS transistor N3, a reference voltage V1 and a resistor R1.

Therein can be distinguished two negative feedback loops, the one introduced by the regulation circuit 10 and the one introduced by the limitation current 11. The first feedback loop has the function of regulating the voltage on the circuit node A in such a manner that the current IR is proportional to the resistor Rext.

The second feedback loop has the function of limiting the current IR when the value of the resistor Rext falls below a certain value. In particular the current IR never exceeds the maximum value given by the following formula.

$$I_{RMAX} = \frac{V_1}{R_1}$$

The present result applied to the equation of the limitation current IL gives the maximum value which the limitation current can assume.

$$I_{LMAX}=K\cdot I_{RMAX}$$

The above mentioned solution however presents in principle the characteristic of having two negative feedback loops and this characteristic involves a considerable circuit complexity and nearly always the need for having compensation capacitors inserted in the feedback loop with the obvious disadvantage of waste of surface area on the integrated circuit.

The technical problem underlying the present invention is to generate a reference current for a circuit limiting the maximum current delivered by a power transistor and inversely proportional to the value of a resistor and at the same time self-limited while utilizing a single feedback loop.

This technical problem is solved by a circuit for limitation of the maximum current delivered by a power transistor of the type indicated and defined in this specification.

The technical problem is also solved by a power actuator protected at output from overloads and short circuits of the type indicated and defined in this specification.

The characteristics and advantages of the method in accordance with the present invention are set forth in the detailed description of an embodiment thereof given below by way of non-limiting example with reference to the annexed drawings.

BRIEF DESCRIPTION OF THE DRAWINGS

FIG. 1 shows a circuit diagram of a final stage of a power actuator incorporating a current limitation circuit, FIG. 2 shows a circuit diagram of a generator circuit for a reference current provided in accordance with the prior art.

DETAILED DESCRIPTION OF A PREFERRED EMBODIMENT OF THE INVENTION

Figure 3:
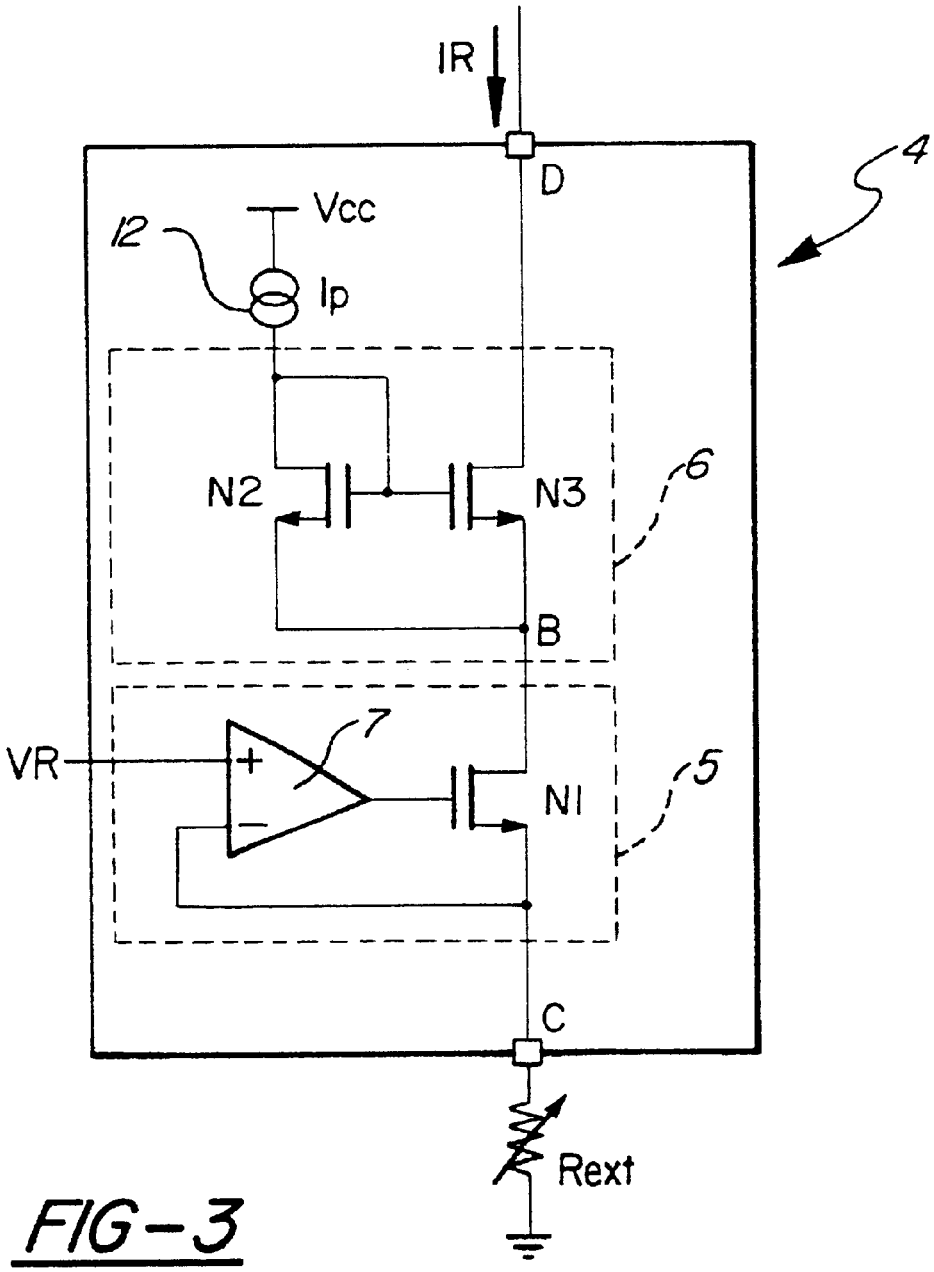
FIG. 3 shows a circuit diagram of a generator circuit generating a reference current and provided in accordance with the present invention.

FIG. 3 shows a generator circuit for generation of a reference current provided in accordance with the present invention.

This circuit is used in a final stage of a 'high side' power actuator such as that shown in FIG. 1 and described above and in which a power transistor PW is used for supplying power to a load with a positive voltage. Similarly, it could be used in other types of power actuator in which it is necessary to generate a programmable and self-limited reference current.

The circuit of FIG. 3, indicated as a whole by reference number 4, implements in accordance with the present invention the generator circuit for generation of the reference current 4 used in the final stage of FIG. 1.

In the circuit can be distinguished the following circuit parts:

a current generator circuit 5 consisting of an operational amplifier 7 and a transistor N1 of the MOS n-channel type, a limitation circuit 6 with current mirror provided by means of two transistors N2 and N3 of the MOS n-channel type, and a generator 12 of current Ip.

The current generator 12 must be considered not an ideal but a real current generator and thus saturating and whose current tends to zero when the generator 12 tends to saturate.

The operational amplifier 7 has an input terminal of the non-inverting type to which is applied a reference voltage VR and an inverting input terminal connected to a circuit node C. To the node C is also connected an end of a resistor Rext outside the circuit and used to set the value of the current IR.

The voltage VR is a reference voltage generated inside the device by means of a constant voltage generator of known type.

To the output terminal of the amplifier 7 is connected the control terminal of the transistor N1. This transistor N1 has a conduction path connected between the node C and a second circuit node B common with the limitation current 6.

The limitation current 6 with current mirror comprises a primary leg and a secondary leg. The primary leg consists of the transistor N2 in which flows a current Ip generated by the current generator 12. The secondary leg consists of the transistor N3 whose conduction path is connected between the common node B and a third circuit node D. Between the nodes C and D runs the current IR generated by the circuit.

The reference current IR can be calculated by applying Kirchoff's law to the node B by means of the following equation.

$$I_R + \left[\frac{1}{m}\cdot I_R\right] - \frac{V_R}{R_{ext}} = 0$$

from which $$I_R = \frac{m}{m+1}\cdot\frac{V_R}{R_{ext}}$$

where m is the multiplication factor of the current mirror 6.

This formula for the current IR is applicable for values of Rext greater than a certain threshold value equal to $$\frac{V_R}{(m+2)\cdot I_P}$$

below which the current generator IP emerges from saturation and IR assumes the maximum value given by the following equation:

$$I_{RMAX}=m\cdot I_p$$

Hence the reference current IR generated by the circuit in accordance with the present invention is proportional to the value of the resistor Rext but self-limited to the value $I_{RMAX}$.

The current generator of FIG. 3 was used in a power actuator like that shown in FIG. 1 to generate a reference current 4 used for programming a limitation current.

In particular there were used the following values for the reference transistors, resistors and generators of FIG. 1 and FIG. 3.

| | |
|---|---|
| Power Transistor PW: | 4500 cells |
| Sense Transistor PS: | 45 cells |
| Transistor N2: | W = 100 $\mu$m |
| Transistor N3: | W = 400 $\mu$m |
| Resistor RR: | 500 Ohm |
| Resistor RS: | 10 Ohm |

-continued

| | |
|---|---|
| Reference voltage VR: | 1.25 Volt |
| Current generator LP: | [40] *50* microampere |

With these data there were obtained the following values for the parameters n, k and m:

n=100 k=5000 m=4 and the following values for the limitation current IL:

$$I_L = \frac{5000}{R_{EXT}} \text{ for } R_{EXT} > 5K\Omega$$

and for the maximum limitation current $$I_{LMAX}=1A \text{ for } R_{EXT}<5K\Omega$$

A first advantage of the generator circuit in accordance with the present invention is the presence of a single feedback loop permitting saving the presence of at least one compensation capacitor.

In addition the circuit structure is simpler with resulting saving of area and of current absorption.

What is claimed is:

1. A circuit for limitation of the maximum current delivered by a power transistor having at least one control terminal and two principal conduction terminals which identify a principal conduction path, comprising:

a network for detection of the current delivered by the power transistor coupled with the principal conduction path of the power transistor to generate a first electrical signal proportional to said current, a reference network, for generating a second reference electrical signal, inserted between a first and a second power supply pole and comprising the series of at least one resistor and a reference current generator which generates a reference current self-limited and proportional to a third electrical reference signal, and a comparison network for comparing said first and second electrical signals and driving, by means of an output signal dependent upon said first and second signals, the control terminal of the power transistor, wherein said generator of a reference current comprises the series of a current generator circuit which generates a current proportional to said third electrical reference signal and a current mirror circuit designed to limit the maximum current delivered by the current generator circuit.

2. A circuit in accordance with claim 1, wherein the current generator circuit has a first and a second conduction terminal and a reference input terminal for receiving said third electrical reference signal and comprises:

an operational amplifier having a first input terminal connected to the reference input, a second input terminal connected to said second conduction terminal and an output terminal, and a first transistor having a control terminal connected to the output terminal of the operational amplifier and two principal conduction terminals connected respectively to said first and second conduction terminals.

3. A circuit in accordance with claim 2, wherein the first input terminal of the operational amplifier is an input of the non-inverting type and the second input terminal of the operational amplifier is an input of the inverting type.

4. A circuit in accordance with claim 3, wherein the first transistor is a transistor of the MOS n-channel type.

5. A circuit in accordance with claim 1, wherein the current mirror circuit comprises a primary leg consisting of a second transistor in which flows a current generated by a current generator and a secondary leg consisting of a third transistor in which flows the reference current.

6. A circuit in accordance with claim 5, wherein the second transistor and the third transistor are transistors of the MOS n-channel type.

7. A power actuator of the intelligent type comprising:

at least one power transistor having at least one control terminal and two principal conduction terminals which identify a principal conduction path, and a circuit for limitation of the maximum current delivered by the power transistor, comprising:

a network for detection of the current delivered by the power transistor coupled with the principal conduction path of the power transistor to generate a first electrical signal proportional to said current, a reference network for generating a second electrical reference signal inserted between a first and a second power supply pole comprising the series of at least one resistor and one reference current generator which generates a reference current self-limited and proportional to a third electrical reference signal, a comparison network for comparing said first and second electrical signals and driving by means of an output signal dependent upon said first and second signals the control terminal of the power transistor, and wherein said reference current generator comprises the series of a current generator circuit which generates a current proportional to said third electrical reference signal and a current mirror circuit designed to limit the maximum current delivered by the current generator circuit.

8. A power actuator in accordance with claim 7, wherein the current generator circuit has a first and a second conduction terminals and a reference input terminal for receiving said third electrical reference signal and comprises:

an operational amplifier having a first input terminal connected to the reference input and a second input terminal connected to said second conduction terminal and an output terminal, and a first transistor having a control terminal connected to the output terminal of the operational amplifier (7) and two principal conduction terminals connected respectively to said first and second conduction terminals.

9. A power actuator in accordance with claim 7 wherein the current mirror circuit comprises a primary leg consisting of a second transistor in which flows a current generated by a current generator and a secondary leg consisting of a third transistor in which flows the reference current.

*10. A circuit for limitation of the maximum current delivered by a power transistor having at least one control terminal and two principal conduction terminals which identify a principal conduction path, comprising:*

*a network for detection of the current delivered by the power transistor coupled with the principal conduction path of the power transistor to generate a first electrical signal proportional to said current;*

*a reference network, for generating a second reference electrical signal, inserted between a first and second power-supply pole and comprising the series of at least one resistor and a reference-current generator which generates a reference current self limited and proportional to a third electrical reference signal;*

*a comparison network for comparing said first and second electrical signals and driving, by means of an output signal dependent upon said first and second signals, the control terminal of the power transistor; and*

*wherein said reference-current generator comprises the series of a current-generating circuit which generates a current proportional to said third electrical reference signal and a current-limiting circuit designed to limit the maximum current delivered by the current-generating circuit without an error-signal amplifier.*

*11. The circuit of claim 10 wherein the current-limiting circuit comprises a primary leg that includes a first transistor through which flows a current generated by a current generator and a secondary leg that includes a second transistor through which flows the reference current.*

*12. The circuit of claim 10 wherein the current-limiting circuit comprises a primary leg that includes a first N-channel transistor through which flows a current generated by a current generator and a secondary leg that includes a second N-channel transistor through which flows the reference circuit.*

*13. An intelligent power actuator, comprising:*

*at least one power translator having at least one control terminal and two principal conduction terminals which identify a principal conduction path; and*

*a circuit for limitation of the maximum current delivered by the power transistor, the circuit comprising,*

*a network for detection of the current delivered by the power transistor coupled with the principal conduction path of the power transistor to generate a first electrical signal proportional to said current,*

*a reference network for generating a second electrical reference signal inserted between a first and a second power-supply pole comprising the series of at least one resistor and one reference-current generator which generates a reference current self-limited and proportional to a third electrical reference signal,*

*a comparison network for comparing said first and second electrical signals and drying by means of an output signal dependent upon said first and second signals the control terminal of the power transistor, and*

*wherein said reference-current generator comprises the series of a current-generator circuit which generates a current proportional to said third electrical reference signal and a current-limiting circuit designed to limit the maximum current delivered by the current-generator circuit without an error-signal amplifier.*

*14. The intelligent power actuator of claim 13 wherein the current-limiting circuit comprises a primary leg that includes a first transistor through which flows a current generated by a current generator and a secondary leg that includes a second transistor through which flows the reference current.*

*15. A circuit, comprising:*

*a first current limiter including a current mirror having a current branch operable to conduct a current and having a limiting branch coupled to the current branch and operable to limit the conducted current to a first level; and*

*a second current limiter coupled to the first current limiter and including a variable impedance operable to conduct the current and including a control circuit operable to cause the variable impedance to limit the current to a second level that is different than the first level.*

*16. The circuit of claim 15 wherein the second level is higher than the first level.*

*17. The circuit of claim 15 wherein the first current limiter is serially coupled to the second current limiter.*

*18. The circuit of claim 15 wherein:*

*the current branch of the current mirror comprises a first transistor having a first conduction terminal, a control terminal, and a second conduction terminal, the first transistor operable to conduct the current between the first and second conduction terminals; and*

*the limiting branch of the current mirror comprises:*

*a current source coupled to the control terminal of the first transistor; and*

*a second transistor having a first conduction terminal and a control terminal coupled to the current source and having a second conduction terminal coupled to the second conduction terminal of the first transistor.*

*19. The circuit of claim 15 wherein:*

*the current branch of the current mirror comprises a first transistor of a first size having a first conduction terminal, a control terminal, and a second conduction terminal, the first transistor operable to conduct the current via the first and second conduction terminals; and*

*the limiting branch of the current mirror comprises:*

*a current source coupled to the control terminal of the first transistor and operable to generate a limiting current having a maximum level; and*

*a second transistor of a second size having a first conduction terminal and a control terminal coupled to the current source and a second conduction terminal coupled to the second conduction terminal of the first transistor, the second transistor operable to conduct the limiting current via the first and second terminals and operable to limit the current through the first transistor to the first level, which equals the product of the maximum level of the limiting current and the ratio of the first size to the second size.*

*20. The circuit of claim 15, further comprising:*

*wherein the variable impedance of the second current limiter comprises a transistor having first and second conduction terminals and a control terminal, the transistor operable to conduct the current via the first and second conduction terminals;*

*a sense impedance coupled to the second conduction terminal of the transistor and having a value; and*

*wherein the control circuit comprises an amplifier having a first input terminal operable to receive a reference voltage, a second input terminal coupled to the second conduction terminal of the transistor, and an output terminal coupled to the control terminal of the transistor, the amplifier operable to limit the current through the transistor to the second level, which equals the reference voltage divided by the value of the sense impedance.*

*21. A method, comprising:*

*generating a drive current that is related to a substantially constant reference voltage;*

*limiting the reference voltage to a first level with a voltage limiter; and*

*limiting the reference voltage to a second level that is different than the first level with a current mirror that*

*is serially coupled to the voltage limiter if the voltage limiter fails to limit the voltage to the first level.*

*22. The method of claim 21 wherein limiting the reference voltage to a second level comprises limiting the reference voltage to a second level that is higher than the first level if the voltage limiter would otherwise allow the first level to fall below the second level, the reference voltage being measured with respect to a supply node.*

*23. A circuit comprising:*

*a transistor operable to generate a drive current;*

*a controller coupled to the transistor, operable to receive a reference current, and operable to control the transistor so as to limit the drive current to a drive-limit level that is related to the reference current; and*

*a reference-current generator coupled to the controller and comprising,*

*a first current limiter having no feedback amplifier and operable to provide the reference current to the controller and to limit the reference current to a first level; and*

*a second current limiter coupled to the first current limiter, operable to generate the reference current, and operable to limit the reference current to a second level that is different than the first level.*

*24. A circuit, comprising:*

*a device operable to generate a drive current that is related to a reference current;*

*a current generator operable to generate the reference current; and*

*a current mirror coupled to the current generator at a single non-supply node, operable to conduct the reference current, and operable to limit the reference current to a predetermined level.*

*25. The circuit of claim 24 wherein the current mirror comprises a current branch operable to conduct the reference current and having a limiting branch coupled to the current branch and operable to limit the conducted reference current to the predetermined level.*

*26. The circuit of claim 24 wherein the current mirror comprises:*

*a current source;*

*a first transistor having a first conduction terminal, a control terminal coupled to the current source, and a second conduction terminal, the first transistor operable to conduct the reference current between the first and second conduction terminals; and*

*a second transistor having a first conduction terminal and a control terminal coupled to the current source and having a second conduction terminal coupled to the second conduction terminal of the first transistor.*

*27. The circuit of claim 24 wherein the current mirror comprises:*

*a current source for generating a limiting current having a maximum level;*

*a first transistor of a first size having a first conduction terminal, a control terminal coupled to the current source, and a second conduction terminal coupled to the single non-supply node, the first transistor operable to conduct the reference current via the first and second conduction terminals; and*

*a second transistor of a second size having a first conduction terminal and a control terminal coupled to the current source and a second conduction terminal coupled to the second conduction terminal of the first transistor, the second transistor operable to conduct the limiting current via the first and second terminals and operable to limit the reference current through the first transistor to the predetermined level, which equals the product of the maximum level of the limiting current and the ratio of the first size to the second size.*

*28. The circuit of claim 24 wherein the current generator comprises:*

*a transistor having a current path coupled to the single non-supply node and having a control terminal, the transistor operable to generate the reference current through the current path;*

*a sense impedance coupled to the conduction path of the transistor and having a value; and*

*an amplifier having a first input terminal operable to receive a reference voltage, a second input terminal coupled to conduction path of the transistor, and an output terminal coupled to the control terminal of the transistor, the amplifier operable to cause the transistor to generate the reference current having a level that equals the reference voltage divided by the value of the sense impedance.*

*29. The circuit of claim 28 wherein the amplifier is operable to cause the transistor to generate the reference current at a level that is less than the predetermined level.*

*30. The circuit of claim 24 wherein the current mirror is serially coupled to the current generator.*

*31. A circuit, comprising:*

*a transistor operable to generate a drive current;*

*a controller coupled to the transistor, operable to receive a reference current, and operable to control the transistor so as to limit the drive current to a drive-limit level that is related to the reference current; and*

*a reference-current generator coupled to the controller and comprising,*

*a current generator operable to generate the reference current having a first level; and*

*a current limiter coupled to the current generator, operable to conduct the reference current, and operable to limit the reference current to a second level that is different than the first level without a negative-feedback amplifier.*

*32. The circuit of claim 31 wherein the controller comprises a feedback controller.*

*33. A circuit, comprising:*

*a reference node, an intermediate node, and a first supply node;*

*a device operable to generate a drive current that is related to a first reference voltage on the reference node;*

*a voltage limiter coupled between the reference and intermediate nodes and operable to limit the reference voltage on the reference node to a predetermined voltage level; and*

*a reference-voltage generator coupled between the intermediate node and the first supply node, coupled to the voltage limiter at and only at the intermediate node, and operable to generate the first reference voltage on the reference node.*

*34. The circuit of claim 33 wherein the first reference voltage is higher than the predetermined voltage level when the voltage is measured with respect to ground.*

*35. The circuit of claim 33 wherein the voltage limiter is serially coupled to the reference-voltage generator.*

*36. The circuit of claim 33 wherein the reference-voltage generator comprises:*

*a transistor having first conduction terminal coupled to the intermediate node, a second conduction terminal, and a control terminal, the transistor operable to generate a current through the intermediate node;*

*a sense impedance coupled between the second conduction terminal of the transistor and the first supply node and having a value; and*

*an amplifier having a first input terminal operable to receive a second reference voltage, a second input terminal coupled to the second conduction terminal of the transistor, and an output terminal coupled to the control terminal of the transistor, the amplifier operable to cause the transistor to generate the current equal to the second reference voltage divided by the value of the sense impedance.*

*37. The circuit of claim 33 wherein the voltage limiter comprises:*

*a current source;*

*a first transistor having a first conduction terminal coupled to the intermediate node, a control terminal coupled to the current source, and a second conduction terminal coupled to the reference node, the first transistor operable to conduct a current through the first and second nodes, the current having a first current level;*

*a second transistor having a first conduction terminal coupled to the intermediate node and having a control terminal and a second conduction terminal coupled to the current source; and*

*wherein the current source and second transistor are operable to limit the current to a second current level that is different than the first current level.*

*38. The circuit of claim 33, further comprising:*

*a second supply node; and*

*an impedance coupled between the reference node and the second supply node.*

*39. A circuit, comprising:*

*a transistor operable to generate a drive current;*

*a controller coupled to the transistor, operable to receive a reference voltage, and operable to control the transistor so as to limit the drive current to a drive-limit level that is related to the reference voltage; and*

*a reference-voltage generator coupled to the controller and comprising,*

*a first voltage limiter operable to provide the reference voltage to the controller and to limit the reference voltage to a first level; and*

*a second voltage limiter coupled to the first voltage limiter and having no error amplifier, the second voltage limiter operable to limit the reference voltage to a second level that is different than the first level.*

*40. The circuit of claim 39 wherein the first voltage limiter is serially coupled to the second voltage limiter.*

*41. A circuit, comprising:*

*a node;*

*a voltage generator coupled to the node and operable to generate a voltage on the node, the voltage having a first voltage level, the voltage generator comprising*

*a transistor having first conduction terminal coupled to the node, a second conduction terminal, and a control terminal, the transistor operable to generate a current through the node,*

*a sense impedance coupled to the second conduction terminal of the transistor and having a value, and*

*an amplifier having a first input terminal operable to receive a reference voltage, a second input terminal coupled to the second conduction terminal of the transistor, and an output terminal coupled to the control terminal of the transistor, the amplifier operable to cause the transistor to generate the current equal to the reference voltage divided by the value of the sense impedance;*

*a voltage limiter coupled to the node and operable to limit the voltage to a second voltage level that is different than the first voltage level without amplifying an error signal, wherein the voltage limiter comprises,*

*a current source,*

*a first transistor having a first conduction terminal coupled to the node, a control terminal coupled to the current source, and a second conduction terminal, the first transistor operable to conduct a current through the node, the current having a first current level,*

*a second transistor having a first conduction terminal and a control terminal coupled to the current source and having a second conduction terminal coupled to the second conduction terminal of the first transistor, and*

*wherein the current source and second transistor are operable to limit the current to a second current level that is different than the first current level; and*

*wherein the voltage generator is serially coupled to the voltage limiter.*

*42. The circuit of claim 41 wherein the second voltage level is lower than the first voltage level when the voltage is measured with respect to ground.*

*43. The circuit of claim 41, further comprising:*

*a supply node; and*

*an impedance coupled between the node and the supply node.*

*44. A method, comprising:*

*generating a reference voltage having a first level with a voltage generator;*

*generating a drive current;*

*preventing the drive current from exceeding a level that is related to the reference voltage; and*

*preventing the reference voltage from falling below a second level that is lower than the first level with a voltage limiter that is coupled to the voltage generator at a single non-supply node.*

*45. The method of claim 44 wherein preventing the reference voltage comprises preventing the reference voltage from falling below the second level if the voltage generator would otherwise generate the voltage at a level lower than the second level.*

*46. A method, comprising:*

*generating a reference voltage having a first level;*

*generating a drive current;*

*preventing the drive current from exceeding a predetermined level that is related to the reference voltage; and*

*preventing the reference voltage from falling below a second level that is lower than the first level with a current mirror.*

*47. A circuit, comprising:*

*a transistor operable to generate a drive current;*

*a controller coupled to the transistor, operable to receive a reference voltage, and operable to control the transistor so as to limit the drive current to a drive-limit level that is related to the reference voltage; and*

*a reference-voltage generator coupled to the controller and comprising,*

*a voltage generator operable to generate the reference voltage having a first level; and*

*a voltage limiter serially coupled to the voltage generator and operable to limit the reference voltage to a second level that is different than the first level without amplifying an error signal.*

*48. A method, comprising:*

*generating a drive current that is proportional to a substantially constant reference current;*

*generating the reference current having a first level with a reference-current generator; and*

*preventing the reference current from exceeding a second level that is higher than the first level with a current limiter that has no feedback amplifier and that is serially coupled to the current generator.*

*49. A method, comprising:*

*generating a drive current that is related to a reference current;*

*setting the reference current to a first level with a reference-current generator; and*

*limiting the reference current to a second level that is different than the first level with a current limiter if the reference current exceeds the first level, the current limiter being coupled to the reference-current generator at a single non-supply node.*

*50. The method of claim 49 wherein limiting the reference current to a second level comprises limiting the reference current to a second level that is higher than the first level if the reference current exceeds the first level.*

* * * * *